United States Patent
Arens et al.

(10) Patent No.: US 12,482,725 B2
(45) Date of Patent: Nov. 25, 2025

(54) POWER SEMICONDUCTOR MODULE ARRANGEMENTS AND METHODS FOR PRODUCING POWER SEMICONDUCTOR MODULE ARRANGEMENTS

(71) Applicant: Infineon Technologies AG, Neubiberg (DE)

(72) Inventors: Andre Arens, Rüthen (DE); Martin Goldammer, Soest (DE)

(73) Assignee: Infineon Technologies AG, Neubiberg (DE)

( * ) Notice: Subject to any disclaimer, the term of this patent is extended or adjusted under 35 U.S.C. 154(b) by 401 days.

(21) Appl. No.: 18/138,245

(22) Filed: Apr. 24, 2023

(65) Prior Publication Data

US 2023/0343681 A1    Oct. 26, 2023

(30) Foreign Application Priority Data

Apr. 25, 2022  (EP) ..................................... 22169656

(51) Int. Cl.
| | | |
|---|---|---|
| H01L 23/00 | (2006.01) | |
| H01L 21/56 | (2006.01) | |
| H01L 23/49 | (2006.01) | |
| H01L 25/07 | (2006.01) | |

(52) U.S. Cl.
CPC ............ H01L 23/49 (2013.01); H01L 21/565 (2013.01); H01L 24/32 (2013.01); H01L 24/48 (2013.01); H01L 24/73 (2013.01); H01L 25/072 (2013.01); *H01L 2224/32225* (2013.01);
(Continued)

(58) Field of Classification Search
CPC ....... H01L 23/49; H01L 21/565; H01L 24/32; H01L 24/48; H01L 24/73; H01L 25/072; H01L 2224/32225; H01L 2224/48155; H01L 2224/73265; H01L 2924/182; H01L 24/29; H01L 24/40; H01L 2224/291; H01L 2224/29139; H01L 2224/40227; H01L 2224/48091; H01L 2224/48227; H01L 2224/48472; H01L 23/053; H01L 23/24;
(Continued)

(56) References Cited

U.S. PATENT DOCUMENTS

| | | |
|---|---|---|
| 2005/0104189 A1 | 5/2005 | Akagawa et al. |
| 2019/0172763 A1 | 6/2019 | Joko et al. |

FOREIGN PATENT DOCUMENTS

| | | |
|---|---|---|
| DE | 102013216035 B3 | 1/2015 |
| JP | 559110141 A | 6/1984 |
| JP | 2003068979 A | 3/2003 |

*Primary Examiner* — Elias Ullah
(74) *Attorney, Agent, or Firm* — Murphy, Bilak & Homiller, PLLC

(57) ABSTRACT

A power semiconductor module arrangement includes a housing that includes sidewalls, a lid, protrusions, a substrate, a plurality of components arranged on the substrate, and an encapsulant partly filling the interior of the housing, thereby covering the substrate, wherein each of the protrusions extends from the lid of the housing, a lower end of the protrusions is arranged directly on one of the components, or within a defined radius around one of the components, and wherein the lower end of a protrusion is the end facing away from the lid and towards the substrate, and the encapsulant has a generally flat surface and forms one or more elevations, wherein each of the elevations encloses an upper end of a different one of the components, and encloses the lower end of a respective one of the protrusions.

13 Claims, 3 Drawing Sheets

(52) U.S. Cl.
CPC ............. *H01L 2224/48155* (2013.01); *H01L 2224/73265* (2013.01); *H01L 2924/182* (2013.01)

(58) Field of Classification Search
CPC ......... H01L 23/10; H01L 21/52; H01L 21/54; H01L 23/049
See application file for complete search history.

POWER SEMICONDUCTOR MODULE ARRANGEMENTS AND METHODS FOR PRODUCING POWER SEMICONDUCTOR MODULE ARRANGEMENTS

TECHNICAL FIELD

The instant disclosure relates to power semiconductor module arrangements, and to methods for producing such power semiconductor arrangements.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate.

Some power semiconductor module arrangements often also include a printed circuit board arranged distant from and in parallel to the substrate. The printed circuit board may also be arranged inside the housing. A plurality of different electrical or electrically conducting components (e.g., semiconductor elements, terminal elements, connection elements, etc.) may be arranged on the substrate and/or on the printed circuit board. The power semiconductor module arrangement generally further includes an encapsulant. The encapsulant partly fills the interior of the housing, thereby covering the substrate and the electrical or electrically conducting components that are arranged on the substrate. In power semiconductor module arrangements comprising a printed circuit board arranged inside the housing, the encapsulant usually also covers the printed circuit board and any electrical or electrically conducting components mounted thereon in order to protect the different components and elements from certain environmental conditions and mechanical damage. However, some elements that are mounted on the substrate and/or the printed circuit board may not be entirely covered by the encapsulant. The reason for this may be that the height of the encapsulant above the substrate or above the printed circuit board may be limited for whatever reason. If certain electrical or electrically conducting components that are not entirely covered by the encapsulant are arranged in close proximity to each other, there is a risk that flashover effects occur. This may lead to a malfunctioning or even a complete failure of the power semiconductor module arrangement. Therefore, certain minimum distances have to be observed for affected elements. This restricts the degree of freedom for arranging the different elements in the overall design of the power semiconductor module arrangement.

There is a need for a power semiconductor module arrangement in which elements are sufficiently protected such that minimum distances between different elements may be reduced.

SUMMARY

A power semiconductor module arrangement includes, a housing including sidewalls, a lid, and one or more protrusions, a substrate arranged inside the housing or forming a bottom of the housing, a plurality of electronic or electrically conducting components arranged on the substrate, and an encapsulant partly filling the interior of the housing, thereby covering the substrate, wherein each of the one or more protrusions extends from the lid of the housing in a vertical direction towards the substrate, wherein the vertical direction is a direction perpendicular to the substrate and the lid, a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the substrate, and the encapsulant has a generally flat surface and forms one or more elevations, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the substrate and towards the lid.

Another power semiconductor module arrangement includes a housing including sidewalls, a lid, and one or more protrusions, a substrate arranged inside the housing or forming a bottom of the housing, a printed circuit board arranged inside the housing, vertically above and in parallel to the substrate, a plurality of electronic or electrically conducting components arranged on the printed circuit board and on the substrate, and an encapsulant partly filling the interior of the housing, thereby covering the substrate and the printed circuit board, wherein each of the one or more protrusions extends from the lid of the housing in a vertical direction towards the printed circuit board, wherein the vertical direction is a direction perpendicular to the substrate and the lid, a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the printed circuit board, and the encapsulant has a generally flat surface and forms one or more elevations, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the printed circuit board and towards the lid.

A method includes arranging a substrate with a plurality of electronic or electrically conducting components arranged thereon in a housing or as a bottom of a housing, wherein the housing comprises sidewalls, partly filling the interior of the housing with a liquid, semi-liquid or viscous material, thereby covering the substrate, arranging a lid on the sidewalls, the lid including one or more protrusions, wherein each of the one or more protrusions extends from the lid of the housing in a vertical direction towards the substrate, wherein the vertical direction is a direction perpendicular to the substrate and the lid, a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the substrate, after arranging the lid on the sidewalls, the liquid, semi-liquid or viscous material forms one or more elevations due to the capillary effect, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the substrate and towards the lid, and the method further includes, after the one or more elevations have formed, hardening the liquid, semi-liquid or viscous material such that it forms an encapsulant having a generally flat surface having one or more elevations.

Another method includes arranging a substrate with a plurality of electronic or electrically conducting components arranged thereon in a housing or as a bottom of a housing, wherein the housing includes sidewalls and a lid, the lid comprising one or more protrusions, partly filling the interior of the housing with a liquid, semi-liquid or viscous material through an opening in the lid, thereby covering the substrate, wherein each of the one or more protrusions extends from the lid of the housing in a vertical direction towards the substrate, wherein the vertical direction is a direction perpendicular to the substrate and the lid, a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the substrate, the liquid, semi-liquid or viscous material forms one or more elevations due to the capillary effect, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the substrate and towards the lid, and the method further includes, after the one or more elevations have formed, hardening the liquid, semi-liquid or viscous material such that it forms an encapsulant having a generally flat surface having one or more elevations.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements", That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
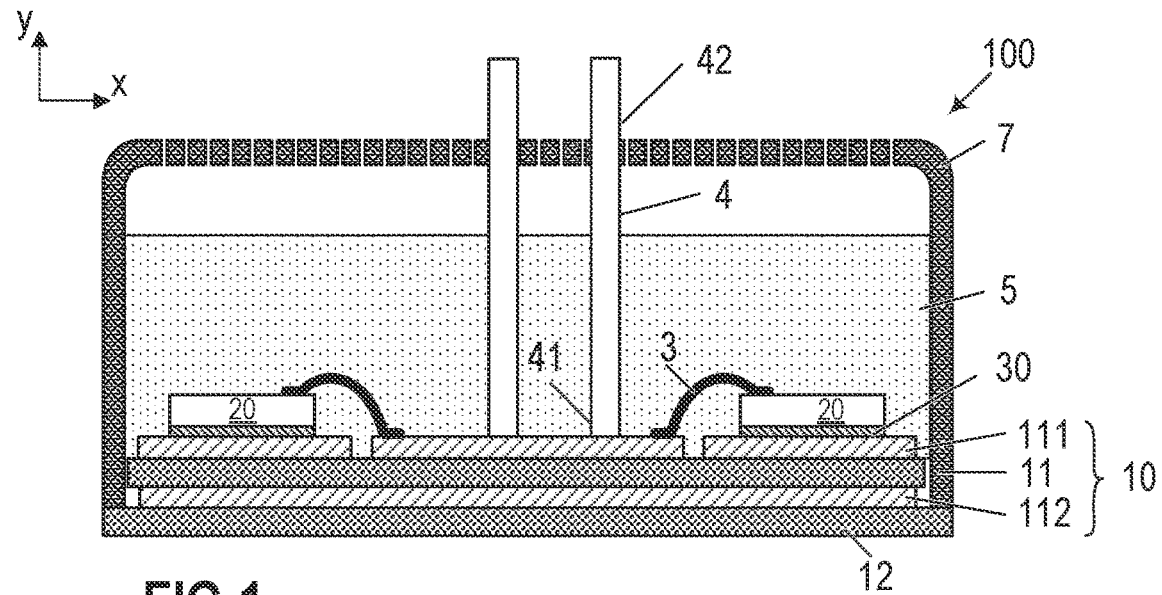
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 µm and about 50 µm. The substrate 10 may also be a conventional printed circuit board (PCMB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 12 which forms a ground surface of the housing 7, while the housing 7 itself solely comprises side-walls and a cover or lid. This is, however, only an example. It is also possible that the housing 7 further comprises a ground surface and the substrate 10 and the base plate 12 be arranged inside the housing 7. In some power semiconductor module arrangements 100, more than one substrate 10 is arranged on a single base plate 12 or on the ground surface of a housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMI (High-Electron-Mobility Transistor), and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connections 3 such as, e.g., bonding wires. Electrical connections 3 may also include connection plates or conductor rails, for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end 41, while a second end 42 of each of the terminal elements 4 protrudes out of the housing 7. The terminal elements 4 may be electrically contacted from the outside at their respective second ends 42. A first part of the terminal elements 4 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Terminal elements 4 could also protrude through the sidewalls of the housing 7 instead of through the cover. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example. For example, the second ends 42 of the terminal elements 4 may be connected to a printed circuit board that is arranged outside of the housing 7 (not illustrated in FIG. 1).

The power semiconductor module arrangement 100 further includes an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 42, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

Figure 2:
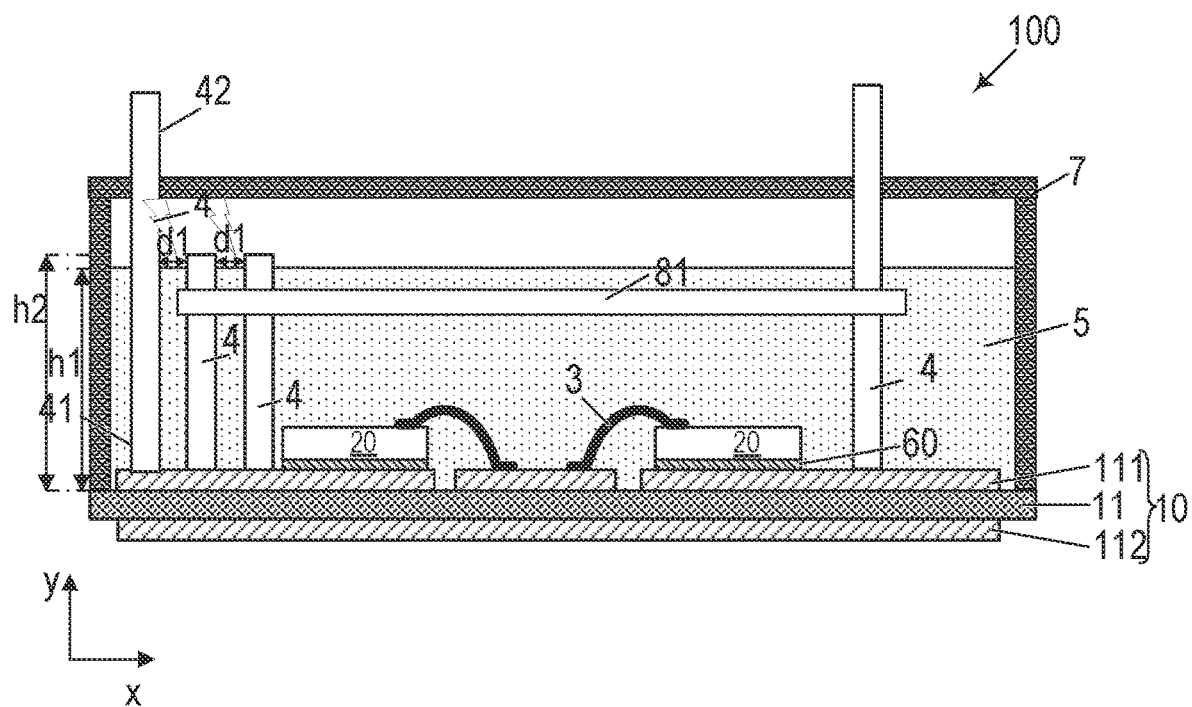
FIG. 2 is a cross-sectional view of another power semiconductor module arrangement.

Now referring to FIG. 2, another power semiconductor module arrangement 100 is schematically illustrated. The power semiconductor module arrangement 100 of FIG. 2 essentially corresponds to the power semiconductor module arrangement 100 that has been explained with respect to FIG. 1 above. However, the power semiconductor module arrangement 100 illustrated in FIG. 2 further comprises a printed circuit board 81. The printed circuit board 81 is coupled to a first subset of the terminal elements 4 and is arranged inside the housing 7. The first subset of the terminal elements 4 may comprise shorter terminal elements that are arranged entirely inside the housing 7. A second subset of the terminal elements 4, however, may extend from the substrate 10 through a through hole in the printed circuit board 81 to the outside of the housing 7, which is exemplarily illustrated for one of the terminal elements 4 of FIG. 2. A third, optional subset of the terminal elements 4, may extend from the substrate 10 to the outside of the housing 7, without contacting the printed circuit board 81 in any way (see terminal element 4 on the far left side of FIG. 2).

According to another example that is not specifically illustrated, one or more terminal elements 4 may be mechanically and electrically coupled to the printed circuit board 81 with their first ends 41, while their second end 42 extends to the outside of the housing 7. By arranging a printed circuit board 81 inside the housing 7, the power semiconductor module arrangement 100 can be implemented in a compact and space saving way, for example. This is, because at least a subset of a plurality of components that is usually arranged on the substrate 10 or on an external printed circuit board (printed circuit board that is arranged outside of the housing 7) can be arranged on the printed circuit board 81 instead of on the substrate 10 or an external printed circuit board. That is, some (or all) components can be arranged on the printed circuit board 81 inside the housing 7, while others (or none) are arranged on an (optional) external printed circuit board. The size of the substrate 10 and/or an external printed circuit board, therefore, can be reduced as compared to arrangements only comprising a substrate 10, or a substrate 10 and an external printed circuit board outside the housing 7 but not the printed circuit board 81 inside the housing 7.

In order to protect the printed circuit board 81 inside the housing 7 and the components arranged on the printed circuit board 81 from certain environmental conditions and mechanical damage, the printed circuit board 81 may also be covered by the encapsulant 5 that has been described with respect to FIG. 1 above.

The encapsulant 5 may have a certain height h1 above the substrate 10 (thickness of the encapsulant 5 in the vertical direction y). This height h1, however, may be restricted due to whatever reason. For example, certain structural characteristics of a power semiconductor module arrangement may limit a maximum thickness or height h1 of the encapsulant 5. This may result in one or more of the components not being entirely covered by the ecapsulant 5. This is exemplarily illustrated for the terminal elements 4 of the first subset in FIG. 2. The second ends 42 of these terminal elements 4 are not entirely covered by the encapsulant 5. That is, a height of the terminal elements h2 may be greater than the thickness of the encapsulant 5. If, for example, the terminal elements 4 are coupled to different electrical potentials, there is a risk that flashover effects occur. This may lead to a malfunctioning or even a complete failure of the power semiconductor module arrangement. Therefore, certain minimum distances d1 usually have to be observed for affected elements. This, however, restricts the degree of freedom for arranging the different elements in the overall design of the power semiconductor module arrangement.

In FIG. 2, this is schematically illustrated for terminal elements electrically coupling the substrate 10 and the printed circuit board 81. The same problem, however, may arise for any other electrical or electrically conducting components that are arranged on the substrate 10 or the printed circuit board 81. Electrical components, for example, may comprise any kind of semiconductor elements or bodies 20. Electrically conducting components may comprise any kind of terminal elements 4 or electrical connections 3, for example. The printed circuit board 81 arranged inside the housing 7 is optional. The effects described above may also arise when no printed circuit board 81 is arranged inside the housing 7 and one or more electrical or electrically conducting components arranged on the substrate 10 are not entirely covered by the encapsulant 5, for whatever reason.

As the height h1 of the encapsulant 5 is restricted in the concerned cases, increasing the overall height h1 of the encapsulant 5 is not possible to entirely cover all of the electric or electrically conducting components in order to prevent flashover effects between electrical or electrically conducting components that are arranged in close proximity to each other. In order to prevent the drawbacks described above, the thickness of the encapsulant 5 may be increased only locally in the range of the concerned components. For this reason, the housing 7 comprises one or more protrusions. This is exemplarily illustrated in FIG. 3. The protrusions 702 extend from the lid of the housing 7 in the vertical direction y towards the substrate 10. The protrusions 702 in this example are arranged directly above the concerned electrical or electrically conducting components in the vertical direction y.

The encapsulant 5, when filled into the housing 7 during the assembly process of the power semiconductor module arrangement, generally is in a liquid, semi-liquid, or viscous state. During a subsequent heating step, liquid is removed from the encapsulant 5, thereby hardening the encapsulant 5 to a certain degree. The heating step may comprise heating the encapsulant 5 to temperatures of above 25° C. For example, the encapsulant. 5 may be heated to temperatures of between 120° C. and 150° C. The material forming the encapsulant 5 may be filled into the housing 7 either before the lid is arranged on the sidewalls, thereby closing the housing. According to another example, the lid may comprise an opening, through which the material forming the encapsulant 5 may be filled into the housing, while the lid is already arranged on the sidewalls.

If the material forming the encapsulant 5 is filled into the housing 7 without the lid, the lid comprising the one or more protrusions 702 may be arranged on the sidewalls while the material is still liquid, semi-liquid, or viscous. The protrusions 702 may either directly adjoin the concerned electrical or electrically conducting components. It is, however, also possible, that the protrusions 702 do not directly contact the concerned electrical or electrically conducting components. That is, a lower end of a protrusion 702 may or may not directly contact an upper end of the concerned electrical or electrically conducting component. This may depend on the form and size of the protrusion and the concerned electrical or electrically conducting component. A maximum distance d2 between the lower end of the protrusion 702 and the upper end of the respective electric or electrical component, however, may be 1 mm, or even 3 mm, in order to achieve the desired effect, as described in the following.

Due to the capillary effect, the liquid, semi-liquid, or viscous material of the encapsulant 5 forms elevations 502 in the range of those components that are not entirely covered by the encapsulant 5. The capillary effect is often also referred to as capillary action and describes the process of a liquid flowing in a narrow space without the assistance of, or even in opposition to, any external forces like gravity. This effect occurs due to the concerned electric or electrical components protruding out of the material of the encapsulant 5, and is increased further by means of the protrusions 702. In this way, elevations 502 are formed, each of the elevations 502 enclosing an upper end of a different one of the plurality of electronic or electrically conducting components in the vertical direction y, and further enclosing the lower end of a separate one of the one or more protrusions 702, wherein the upper end of an electronic or electrically conducting component is an end facing away from the substrate 10 and towards the lid. In this way, the upper ends of critical electrical or electrically conducting components may be covered by the material of the encapsulant 5, without increasing the overall height h1 of the encapsulant 5, thereby protecting the concerned components, and reducing the effect of flashover effects, even if the concerned components are arranged in close proximity to each other. The encapsulant 5 may be hardened similar to what has been described above once the desired elevations 502 have formed.

The same effect occurs when the lid is already mounted on the sidewalls of the housing 7, and the material of the encapsulant 5 is filled through an opening of the housing 7 (e.g., an opening in the lid). In this case, the encapsulant 5 may also be hardened after the desired elevations 502 have formed. Both options (filling the material into the housing 7 before or after arranging the lid on the sidewalls) are equally possible.

Figure 3:
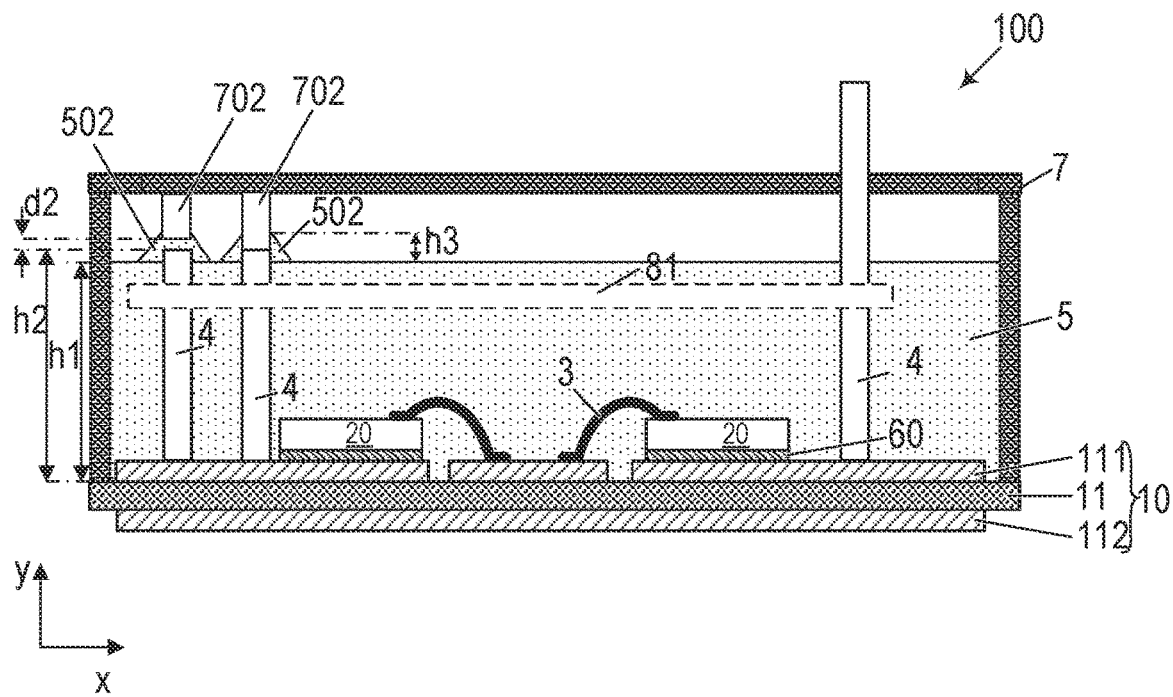
FIG. 3 is a cross-sectional view of a power semiconductor module arrangement according to one example.
Figure 4:
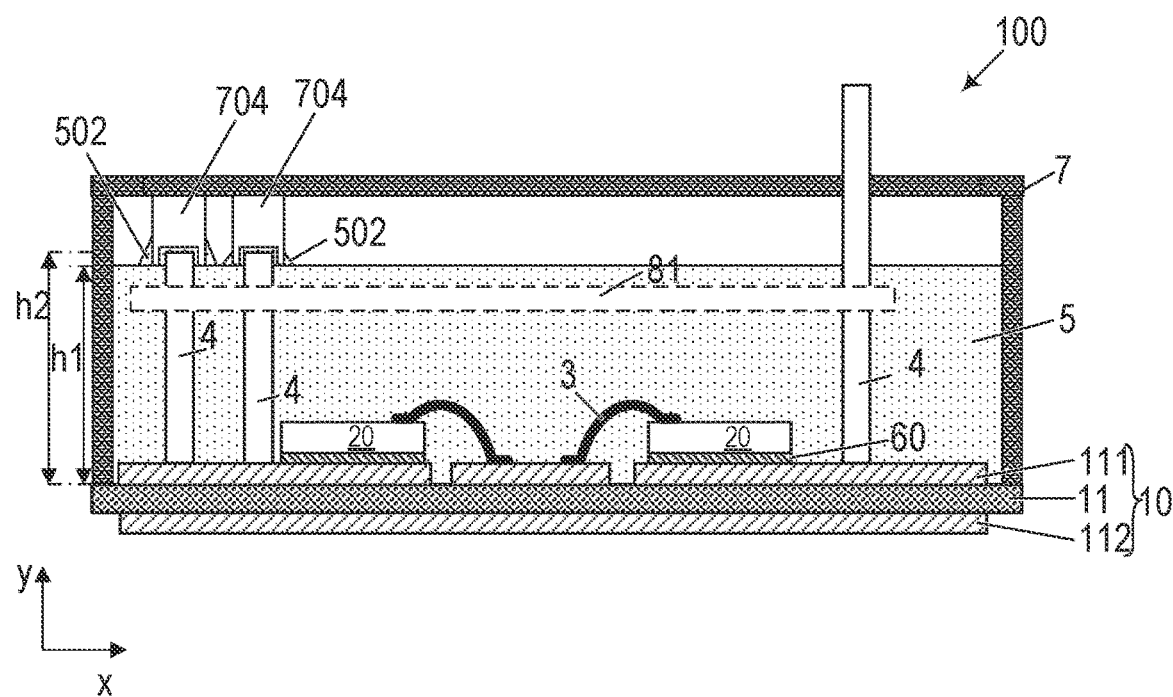
FIG. 4 is a cross-sectional view of a power semiconductor module arrangement according to another example.

In the example illustrated in FIG. 3, the protrusions 702 comprise simple pins. Such pins may have any suitable cross-section such as, e.g., a round, square, or rectangular cross-section. Any other regular or irregular cross-sections, however, are also possible. The pins may be solid or hollow. The pins 702 in the example of FIG. 3 have a flat lower end. The lower ends of the protrusions 704 may also have an irregular lower surface. It is, for example, possible that at least the lower end of one or more of the protrusions 704 forms a sleeve surrounding the respective one of the electronic or electrically conducting components in a horizontal plane, wherein the horizontal plane is perpendicular to the vertical direction y. Pins 704 which form a sleeve surrounding the respective one of the electronic or electrically conducting components are schematically illustrated in FIG. 4. According to one example, one or more of the protrusions 704 comprise a hollow sleeve extending from the lid towards the respective one of the electric or electrically conducting components. In the example illustrated in FIG. 4, the lower ends of the protrusions 704 overlap with the respective one of the electronic or electrically conducting components in the vertical direction y. It is, however, also possible that the lower ends of the protrusions 704 and the electronic or electrically conducting components do not overlap in the vertical direction y, similar to the protrusions 702 illustrated in FIG. 3.

Figure 5:
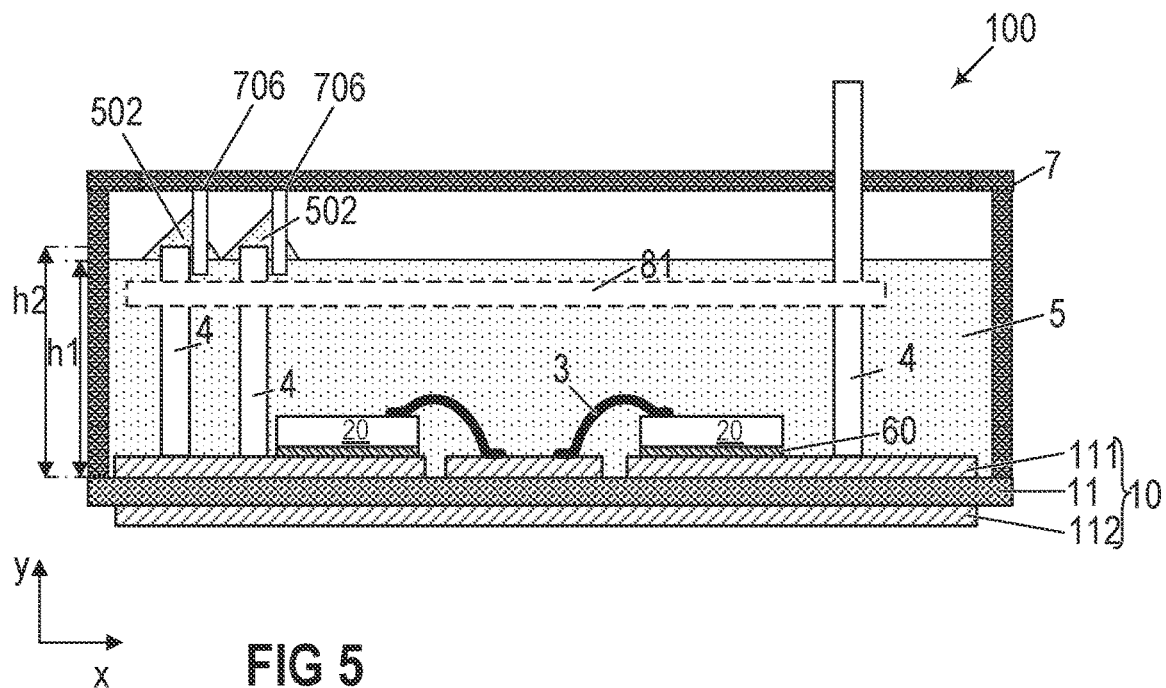
FIG. 5 is a cross-sectional view of a power semiconductor module arrangement according to another example.

While in the examples illustrated in FIGS. 3 and 4, the protrusions 702, 704 are arranged directly above the respective ones of the electronic or electrically conducting components, it is also possible that a lower end of one or more of the one or more protrusions 706 is arranged within a defined radius around a separate one of the plurality of electronic or electrically conducting components. This is schematically illustrated in FIG. 5.

Figure 6:
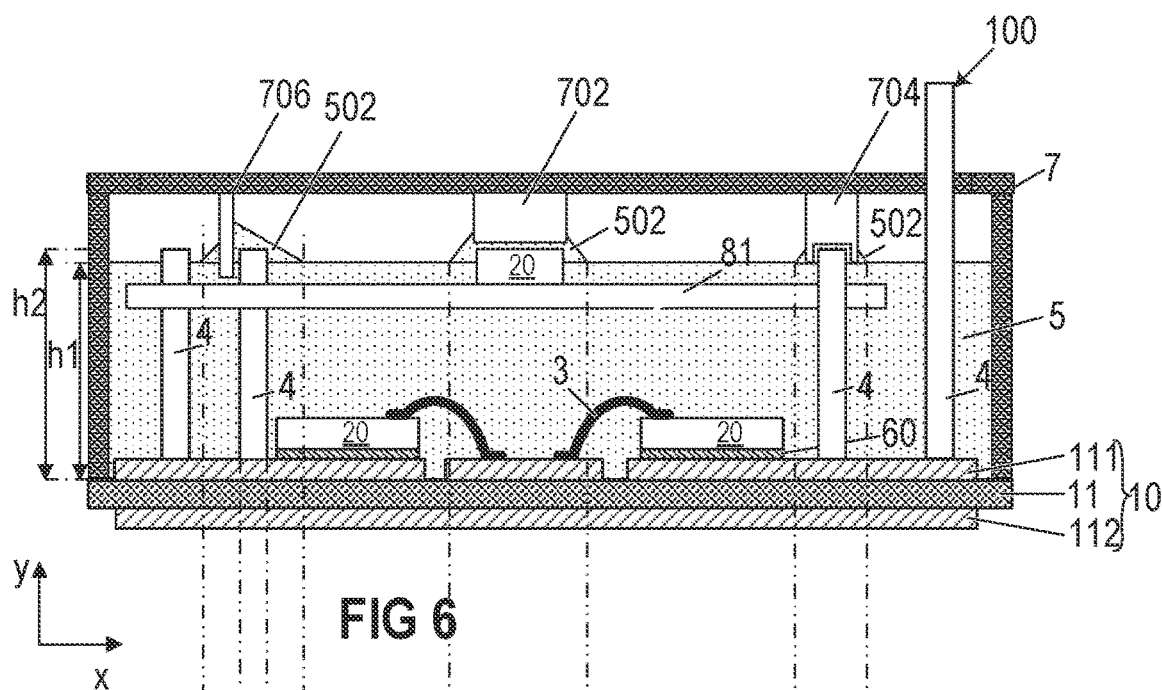
FIG. 6 is a cross-sectional view of a power semiconductor module arrangement according to an even further example.
Figure 7A:
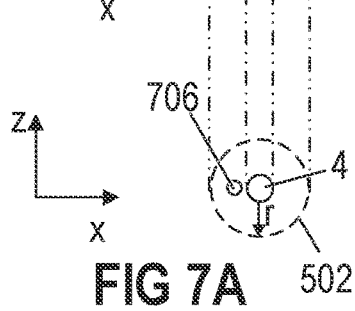
FIG. 7, including FIGS. 7A-7C, schematically illustrates top views of a protrusion arranged within a defined radius around an electronic or electrically conducting component, and a protrusion arranged directly above an electronic or electrically conducting component.
Figure 7B:
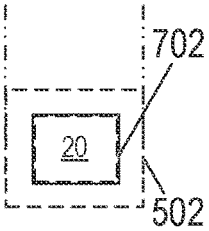
Figure 7C:
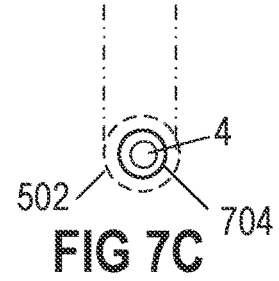

FIG. 6 illustrates several possible arrangements, which are further illustrated in the top views of FIGS. 7A, 7B, and 7C. In the example illustrated in FIG. 6, first protrusions 702 are arranged directly above the semiconductor bodies 20. In this example, a cross-section of the protrusions 702 corresponds to the cross-section of the respective semiconductor body 20, which is schematically illustrated in FIG. 7B. It is, however, also possible that a cross-section of a first protrusion 702 is slightly smaller or larger than the cross-section of the respective electric or electrically conducting component. According to one example, slightly smaller or larger refers to a cross-section of a first protrusion 702 that is between 0 and 10% smaller or larger than the cross-section of the respective electric or electrically conducting component. However, the cross-section of the first protrusion 702 in relation to the cross-section of the respective electric or electrically conducting component should generally be chosen such that the capillary effect is strong enough to achieve the desired results and an elevation 502 of the encapsulant 5 is formed. As has been discussed with respect to FIG. 3 above, the first protrusions 702 may or may not directly contact the respective one of the electric or electrically conducting component.

A second protrusion 706 is arranged such that its lower end is within a defined radius around a respective one of the plurality of electronic or electrically conducting components. This is further illustrated in the top view of FIG. 7A which illustrates the terminal element 4 and a radius r defined around the terminal element 4 in a horizontal plane. The lower end of the second protrusion 706 is within this defined radius r. If the defined radius r is sufficiently small, the capillary effect as described above occurs, resulting in an elevation 502 of the encapsulant 5, covering the respective one of the electric or electrically conducting components. For example, the defined radius may be less than 2 mm, or even less than 1 mm. For protrusions that are arranged further away from a respective one of the components, the capillary effect may no longer occur.

The arrangement illustrated in FIG. 6 further comprises a third protrusion 704 comprising a hollow sleeve extending from the lid towards the respective one of the electric or electrically conducting components (terminal element 4 in FIG. 6), similar to what has been described with respect to FIG. 4 above. This is further illustrated in FIG. 7C which illustrates a terminal element 4 and the hollow sleeve of the third protrusion 704 surrounding the terminal element 4.

By arranging protrusions 702, 704, 706 in the ways described above, it is possible to form elevations 502 of the encapsulant 5 having a height h3 of between 0.1 mm and 3 mm in the vertical direction y (see, e.g., FIG. 3). An elevation 502 may be essentially symmetric if a protrusion 702, 704 is arranged directly above a respective one of the electric or electrically conducting components. If, however, a protrusion 706 is arranged adjacent to a respective one of the one or more electric or electrically conducting components within a defined radius r, the elevation 502 that forms may be asymmetric. By forming one or more elevations 502 in the range of critical electric or electrically conducting components, the thickness (height) of the encapsulant 5 is locally increased, each elevation 502 covering one of the one or more critical electric or electrically conducting components.

As has been described above, the encapsulant 5, during the heating step, may be heated to temperatures of between 120° C. and 150° C. At high temperatures, however, the material of the encapsulant 5 expands to a certain degree. Therefore, lower temperatures may be used during the heating step such as, for example, temperatures of between 50° C. and 80° C.

The invention claimed is:

1. A power semiconductor module arrangement comprises,
    a housing comprising sidewalls, a lid, and one or more protrusions;
    a substrate arranged inside the housing or forming a bottom of the housing;
    a plurality of electronic or electrically conducting components arranged on the substrate, and
    an encapsulant partly filling an interior of the housing, thereby covering the substrate; wherein
    each of the one or more protrusions extends from the lid of the housing in a vertical direction towards the substrate, wherein the vertical direction is a direction perpendicular to the substrate and the lid,
    a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the substrate, and the encapsulant has a generally flat surface and forms one or more elevations, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the substrate and towards the lid.

2. The power semiconductor module arrangement of claim 1, wherein at least one of the one or more protrusions comprises a pin.

3. The power semiconductor module arrangement of claim 2, wherein the pin has a flat lower end.

4. The power semiconductor module arrangement of claim 2, wherein the lower end of the pin forms a sleeve surrounding the respective one of the electronic or electrically conducting components in a horizontal plane, wherein the horizontal plane is perpendicular to the vertical direction.

5. The power semiconductor module arrangement of claim 1, wherein the lower end of at least one of the one or more protrusions directly adjoins the upper end of one of the plurality of electronic or electrically conducting components.

6. The power semiconductor module arrangement of claim 1, wherein a maximum distance between the lower end of a protrusion and the upper end of a respective one of the electric or electrical components is 1 mm, or 3 mm.

7. The power semiconductor module arrangement of claim 1, wherein each of the elevations has a height of between 0.1 mm and 3 mm in the vertical direction (y).

8. The power semiconductor module arrangement of claim 1, wherein at least one of the one or more protrusions comprises a hollow sleeve extending from the lid towards the respective one of the electric or electrically conducting components.

9. The power semiconductor module arrangement of claim 1, wherein
a lower end of one or more protrusions is arranged directly above a separate one of the plurality of electronic or electrically conducting components; and
a cross-section of the one or more protrusions corresponds to the cross-section of the respective one of the electric or electrical components.

10. The power semiconductor module arrangement of claim 1, wherein
a lower end of one or more protrusions is arranged directly above a separate one of the plurality of electronic or electrically conducting components; and
a cross-section of the one or more protrusions is between 0 and 10% smaller or larger than a cross-section of the respective one of the electric or electrically conducting components.

11. A power semiconductor module arrangement, comprising:
a housing comprising sidewalls, a lid, and one or more protrusions;
a substrate arranged inside the housing or forming a bottom of the housing;
a printed circuit board arranged inside the housing, vertically above and in parallel to the substrate;
a plurality of electronic or electrically conducting components arranged on the printed circuit board and on the substrate, and an encapsulant partly filling the interior of the housing, thereby covering the substrate and the printed circuit board; wherein each of the one or more protrusions extends from the lid of the housing in a vertical direction towards the printed circuit board, wherein the vertical direction is a direction perpendicular to the substrate and the lid, a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the printed circuit board, and the encapsulant has a generally flat surface and forms one or more elevations, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the printed circuit board and towards the lid.

12. A method, comprising:
arranging a substrate with a plurality of electronic or electrically conducting components arranged thereon in a housing or as a bottom of a housing, wherein the housing comprises sidewalls;
partly filling the interior of the housing with a liquid, semi-liquid or viscous material, thereby covering the substrate; and
arranging a lid on the sidewalls, the lid comprising one or more protrusions; wherein
each of the one or more protrusions extends from the lid of the housing in a vertical direction towards the substrate, wherein the vertical direction is a direction perpendicular to the substrate and the lid,
a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away from the lid and towards the substrate,
after arranging the lid on the sidewalk, the liquid, semi-liquid or viscous material forms one or more elevations due to capillary effect, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the substrate and towards the lid, and
the method further comprises, after the one or more elevations have formed, hardening the liquid, semi-liquid or viscous material such that it forms an encapsulant having a generally flat surface having one or more elevations.

13. A method, comprising:
arranging a substrate with a plurality of electronic or electrically conducting components arranged thereon in a housing or as a bottom of a housing, wherein the housing comprises sidewalls and a lid, the lid comprising one or more protrusions; and partly filling the interior of the housing (7) with a liquid, semi-liquid or viscous material through an opening in the lid, thereby covering the substrate (10), wherein:

each of the one or more protrusions extends from the lid of the housing in a vertical direction towards the substrate, wherein the vertical direction is a direction perpendicular to the substrate and the lid, a lower end of each of the one or more protrusions is either arranged directly above a separate one of the plurality of electronic or electrically conducting components, or within a defined radius around a separate one of the plurality of electronic or electrically conducting components, wherein the defined radius is less than 2 mm, and wherein the lower end of a protrusion is the end facing away front the lid and towards the substrate, the liquid, semi-liquid or viscous material forms one or more elevations due to the capillary effect, wherein each of the one or more elevations encloses an upper end of a different one of the plurality of electronic or electrically conducting components, and encloses the lower end of a respective one of the one or more protrusions, wherein the upper end of an electronic or electrically conducting component is an end facing away from the substrate and towards the lid, and the method further comprises, after the one or more elevations have formed, hardening the liquid, semi-liquid or viscous material such that it forms an encapsulant having a generally flat surface having one or more elevations.

* * * * *

UNITED STATES PATENT AND TRADEMARK OFFICE
CERTIFICATE OF CORRECTION

| | | |
|---|---|---|
| PATENT NO. | : 12,482,725 B2 | Page 1 of 1 |
| APPLICATION NO. | : 18/138245 | |
| DATED | : November 25, 2025 | |
| INVENTOR(S) | : A. Arens et al. | |

It is certified that error appears in the above-identified patent and that said Letters Patent is hereby corrected as shown below:

On the Title Page

Item (56)/Foreign Patent Doc, Column 2, Line 2, please change "559110141" to -- S59110141 --

In the Claims

Column 12, Line 49 (Claim 12, Line 24), please change "sidewalk" to -- sidewalls --

Signed and Sealed this
Twenty-seventh Day of January, 2026

John A. Squires
*Director of the United States Patent and Trademark Office*